US006829514B2

(12) United States Patent
Gyorfi et al.

(10) Patent No.: US 6,829,514 B2
(45) Date of Patent: Dec. 7, 2004

(54) BALANCING WORKLOADS IN AN ELECTRONICS ASSEMBLY FACTORY

(75) Inventors: Julius Gyorfi, Vernon Hills, IL (US); Thomas Tirpak, Glenview, IL (US); Weimin Xiao, Hoffman Estates, IL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/346,693

(22) Filed: Jan. 17, 2003

(65) Prior Publication Data

US 2004/0143352 A1 Jul. 22, 2004

(51) Int. Cl.[7] .............................................. G06F 19/00
(52) U.S. Cl. ........................ 700/99; 700/29; 700/103
(58) Field of Search ............................. 700/28, 95, 97, 700/99–102, 103, 106, 112, 29

(56) References Cited

U.S. PATENT DOCUMENTS

| | | | |
|---|---|---|---|
| 5,170,554 A | * 12/1992 | Davis et al. ................... | 29/832 |
| 5,258,915 A | * 11/1993 | Billington et al. ........... | 700/103 |
| 5,630,070 A | 5/1997 | Dietrich et al. .............. | 395/208 |
| 5,933,349 A | * 8/1999 | Dalgleish et al. ............ | 700/121 |
| 6,198,980 B1 | 3/2001 | Costanza ....................... | 700/99 |
| 6,205,439 B1 | 3/2001 | Gardner ........................... | 706/7 |
| 6,249,715 B1 | 6/2001 | Yuri et al. .................... | 700/111 |
| 6,301,693 B1 | 10/2001 | Naylor et al. ................. | 716/10 |
| 6,341,240 B1 | * 1/2002 | Bermon et al. ................ | 700/97 |
| 6,594,531 B2 | * 7/2003 | Eshelman et al. ............. | 700/28 |
| 6,650,953 B2 | * 11/2003 | Schaffer et al. .............. | 700/103 |
| 2004/0117983 A1 | * 6/2004 | Beck et al. .................... | 29/832 |
| 2004/0153868 A1 | * 8/2004 | Nonaka et al. ................ | 714/47 |

FOREIGN PATENT DOCUMENTS

| EP | 0435451 B1 | 11/1990 | ..................... 17/60 |
|---|---|---|---|
| EP | 0639815 A2 | 8/1994 | ..................... 17/60 |

OTHER PUBLICATIONS

T. Hayrinen et al, "Scheduling Algorithms for Computer–Aided Line Balancing in Printed Circuit Board Assembly." Turku Centre for Computer Science, TUCS Technical Report No. 212, Turku, Finland, Oct. 1998.

R. Pastor et al, "Assembly Line Balancing with Work Zone and Station Load Time Windows Constraints." Proceedings of the 1999 IEEE International Symposium on Assembly and Task Planning, Porto, Portugal, Jul. 1999.

J. Plans et al, "Modelling and Solving the SALB–E Problem." Proceedings of the 1999 IEEE International Symposium on Assembly and Task Planning, Porto, Portugal, 1999.

(List continued on next page.)

*Primary Examiner*—Leo Picard
*Assistant Examiner*—Ryan A. Jarrett

(57) ABSTRACT

A method of optimization of a product assembly line utilizes a mixed-integer linear programming (MILP) formulation. Line information, such as product data of products to be assembled by the line, parts data of the parts to be used to assemble the products, line data descriptive of the product assembly line and machine data of the machines of the line, is compiled and used to formulate a balancing strategy of the product assembly line (210, 240). The balancing strategy is formulated by the selective manipulation of one or more optimization variables to make the MILP closely representative of the actual manufacturing environment (240, 250, 270). Solving the MILP generates MILP output information from which output reports and metrics may be generated (270, 280).

27 Claims, 6 Drawing Sheets

OTHER PUBLICATIONS

I. Or et al, "Optimization Issues in Automated Production of Printed Circuit boards: Operations Sequencing, Feeder Configuration and Load Balancing Problems." Proceedings of the IEEE Conference on Emerging Technologies and Factory Automation, vol. 1, pp. 227–232, 1996.

B. Yin et al, "Adaptive Line Balancing for Flexible Assembly Systems." Proceedings of the IEEE International Conference on Robotics and Automation, vol. 3, pp. 1980–1985, 1994.

R.E. Gunther et al, "Currently Practiced Formulations for the Assembly Line Balance Problem." Journal of Operations Management, vol. 3, No. 4, pp. 209–221, 1983.

J.L.C. Macaskill, "Production–Line Balances for Mixed–Model Lines." Management Science, vol. 19, No. 4, pp. 423–433, 1972.

G.W. DePuy et al, "An Integer Programming Heuristic for Component Allocation in Printed Circuit Card Assembly Systems." Submitted for publication to the Annals of Operations Research on Mathematics of Industrial Systems in 1995.

G.W. DePuy et al, Multiple Assignment of Component Types to Feeder Slots on Automated Printed Circuit Card Placement Machines, IEEE Transactions on Electronics Packaging Manugacturing, vol. 23, No. 3, pp. 157–164, Jul. 2000.

J.C. Ammons et al, "Component Allocation to Balance Workload in Printed Circuit Card Assembly Systems." Submitted for publication to IEE Transactions, 1993.

J.C. Ammons et al, Computer–Aided Process Planning in Printed Circuit Card Assembly, IEEE CHMT Transactions, vol. 16, No. 4, pp. 370–376, Jun. 1993.

L.F. McGinnis et al, "Automated Process Planning for Printed Circuit Card Assembly." IEE Transactions, vol. 24, No. 4, pp. 18–30, Sep. 1992.

Sawik, T., Production Planning and Scheduling in Flexible Assembly Systems, Springer–Verlag, Berlin, 1999, Chap. 5, pp. 107–116.

* cited by examiner

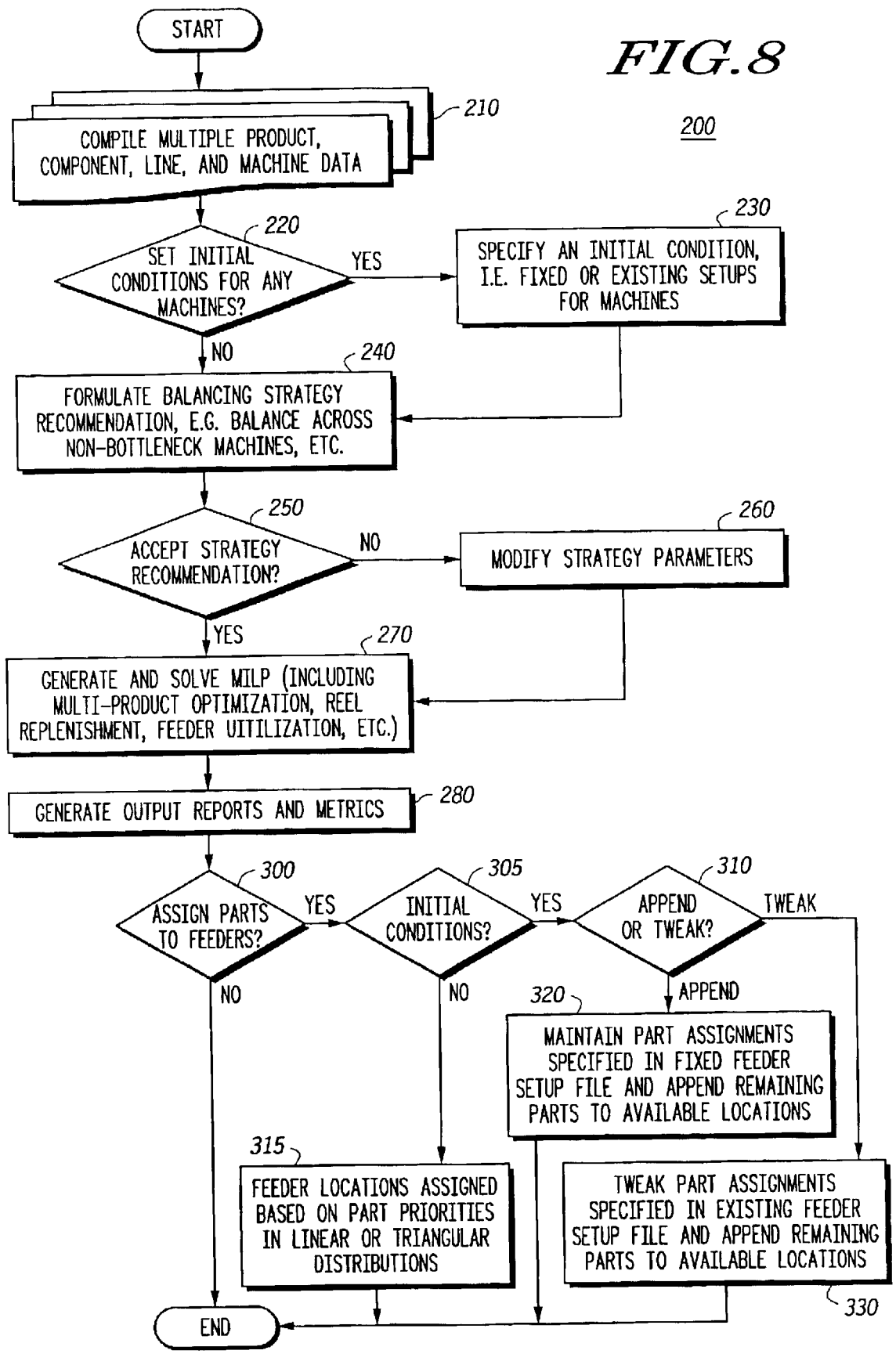

BALANCING WORKLOADS IN AN ELECTRONICS ASSEMBLY FACTORY

FIELD OF THE INVENTION

This invention relates generally to the field of electronics assembly manufacturing and test, and more particularly to line balancing and optimization of product assembly lines using a mixed-integer linear programming (MILP) formulation.

BACKGROUND OF THE INVENTION

Line balancing and optimization of manufacturing and assembly lines have long been a concern in electronics assembly manufacturing and test. The manufacture of different electronic products and assemblies, such as pagers, personal digital assistants (PDAs), cellular telephones, set-top boxes, circuit boards going into base stations, etc., often disparate as to type and functionality, can greatly complicate efforts at line optimization. Of interest is the achievement of throughput maximization, cycle time minimization, and quality improvement through optimized management. Considerations such as the different types of components needed for assembly of different products, the different machine models used in the factory, line configurations, the desired quantity of each product to build, etc. can effect assembly optimization. Even when different types of electronic products and assemblies are not being assembled, similar considerations must be taken into account.

Part of the optimization process for manufacturing and assembly lines may include optimization of the individual machines themselves in addition to line optimization, often following a line balancing analysis. This additional optimization step for multiple machines or stations of a line can be both time consuming and draw upon valuable computing resources.

Mixed-integer linear programming (MILP) formulation of the line balancing problem for electronics assembly has been explored but results have been compromised by an inadequate or incomplete modeling of applicable factors, yielding a formulation that inadequately describes the actual manufacturing environment.

BRIEF DESCRIPTION OF THE DRAWINGS

The features of the invention believed to be novel are set forth with particularity in the appended claims. The invention itself however, both as to organization and method of operation, together with objects and advantages thereof, may be best understood by reference to the following detailed description of the invention, which describes certain exemplary embodiments of the invention, taken in conjunction with the accompanying drawings in which:

FIG. 8 is an overview of the throughput optimization of a manufacturing line using MILP formulation, in accordance with certain embodiments of the present invention.

DETAILED DESCRIPTION OF THE INVENTION

Figure 1:
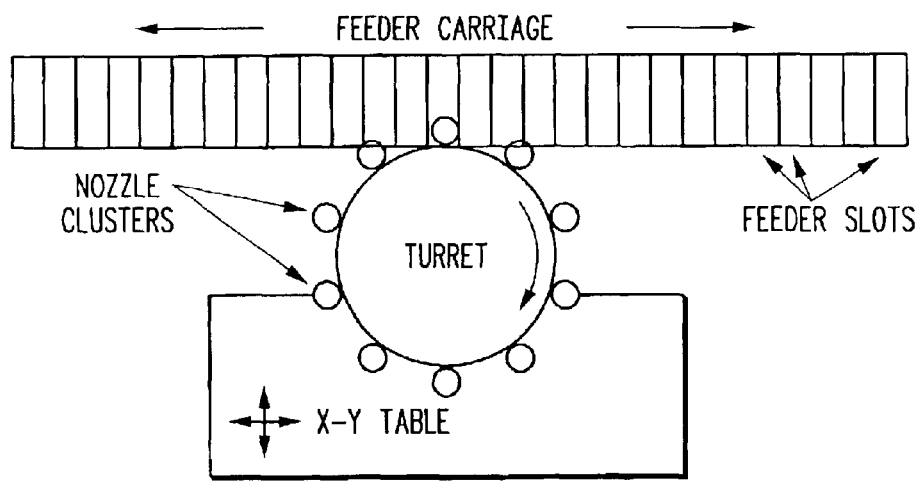
FIGS. 1–6 illustrate exemplary electronics assembly manufacturing and test environments in which various types of feeders and assembly stations.

While this invention is susceptible of embodiment in many different forms, there is shown in the drawings and will herein be described in detail specific embodiments, with the understanding that the present disclosure is to be considered as an example of the principles of the invention and not intended to limit the invention to the specific embodiments shown and described. In the description below, like reference numerals are used to describe the same, similar or corresponding elements in the several views of the drawings.

The terms "a" or "an", as used herein, are defined as one or more than one. The term "plurality", as used herein, is defined as two or more than two. The term "another", as used herein, is defined as at least a second or more. The terms "including" and/or "having", as used herein, are defined as comprising (i.e., open language). The term "coupled", as used herein, is defined as connected, although not necessarily directly, and not necessarily mechanically. The term "program", as used herein, is defined as a sequence of instructions designed for execution on a computer system. A "program", or "computer program", may include a subroutine, a function, a procedure, an object method, an object implementation, in an executable application, an applet, a servlet, a source code, an object code, a shared library/dynamic load library and/or other sequence of instructions designed for execution on a computer system.

The present invention provides a process by which a large-scale, mixed-integer linear program (MILP), is formulated and solved to optimize throughput of a factory line having a number of serially configured machines or assembling stations and potentially operable to assemble a series of different products. Throughput is the quantity of products that can be processed by a factory line or machine during a given period of time. Selective manipulation of various optimization variables in the MILP formulation seeks to optimize throughput by balancing component loads across the machines or stations of a factory line in order to eliminate or mitigate bottlenecks in the line and thus minimize overall cycle time of the line. Feeder utilization should be balanced across available equipment and greater flexibility for implementing a feeder setup strategy is provided. A flexible/custom feeder setup may be generated, or boards can be assigned to subgroups based on bill-of-materials (BOM) similarity. Precedence constraints for components (parts) and shields or for larger and/or heavier parts may be considered. MILP formulation thus seeks to provide a realistic representation of the factory environment. MILP optimization variables include part-to-station assignments, estimated workloads, changing existing setup, parts reel replenishment optimization, flexible/custom setup, feeder utilization optimization, non-bottleneck stations balancing, multi-product optimization and component constraints.

As used herein, cycle time refers to the period of time required to produce a specified quantity of products on a given line or machine; optimization seeks to minimize cycle time. A factory line, such as a surface mount technology (SMT) line, may have multiple assembling stations, and may be used to assemble a series of different products. FIGS. 1–6 provide exemplary illustrates of various assembly machines and line configurations that may be used to assemble products. The station in a SMT line that spent the most time to assemble a product is the bottleneck station of the line for the product. The corresponding assembly time used by the bottleneck machine is the production time of the given product. The total production time of multiple products is the summation of the production time of each product. Thus, as used herein, bottleneck refers to the machine on a line that has the slowest cycle or processing time and that causes other machines on the line to run at its speed. A BOM provides information about the specific components or parts needed to build a particular product on the line. A shield is a larger, flat surface, such as metal, that is placed over and covers underlying smaller components, thereby protecting them from unwanted environmental conditions, like electromagnetic interference (EMI). Workload refers to the amount of parts or components that can be processed in a given time. Feeder slot refers to the physical location on a machine where a component reel is attached.

Figure 2:
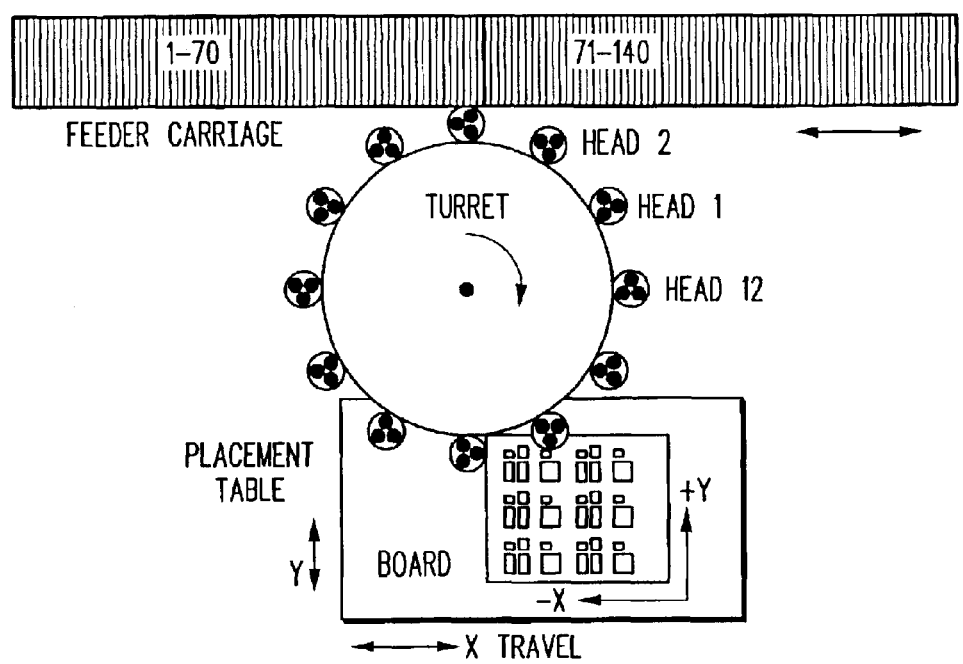
Figure 3:
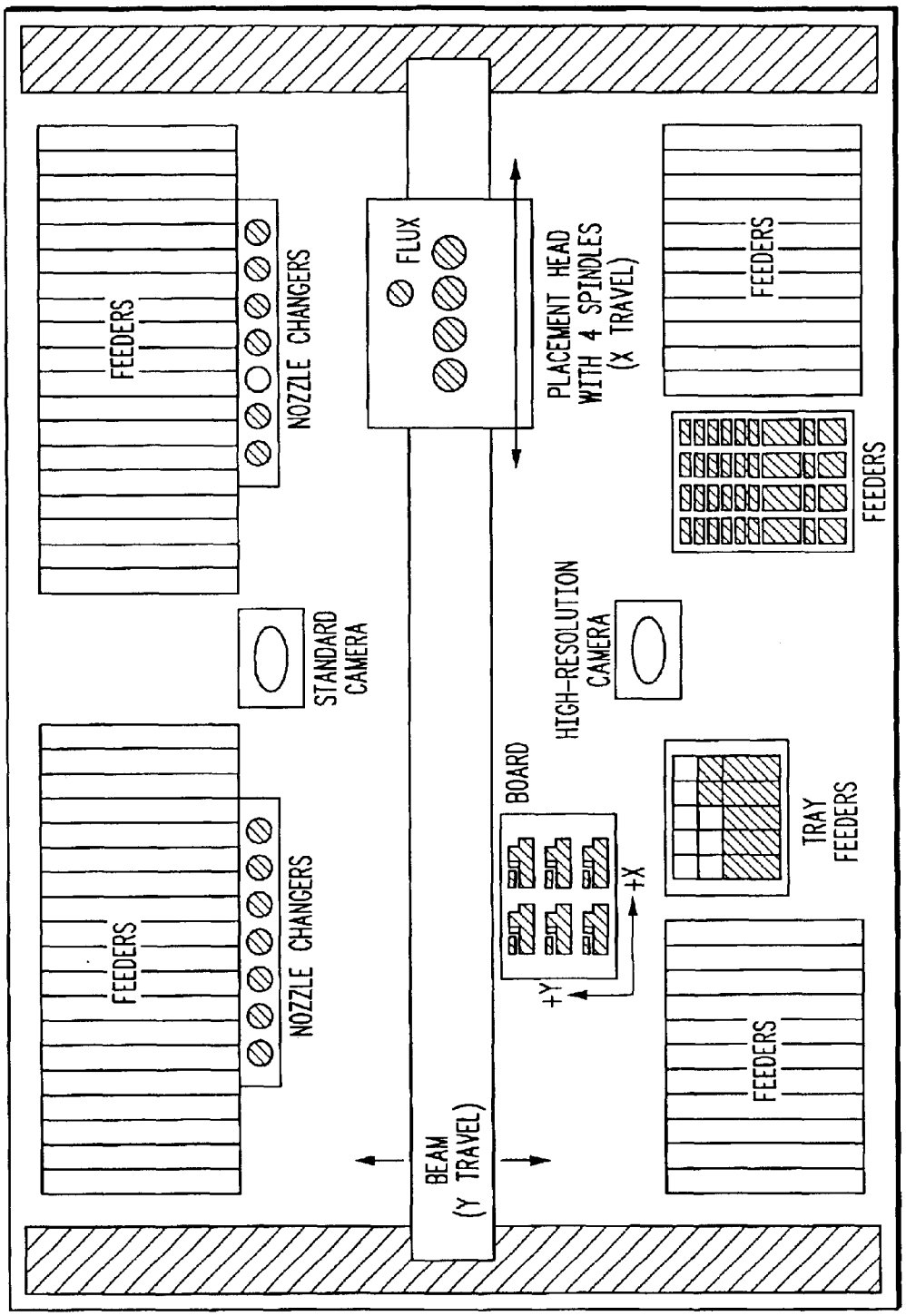
Figure 4:
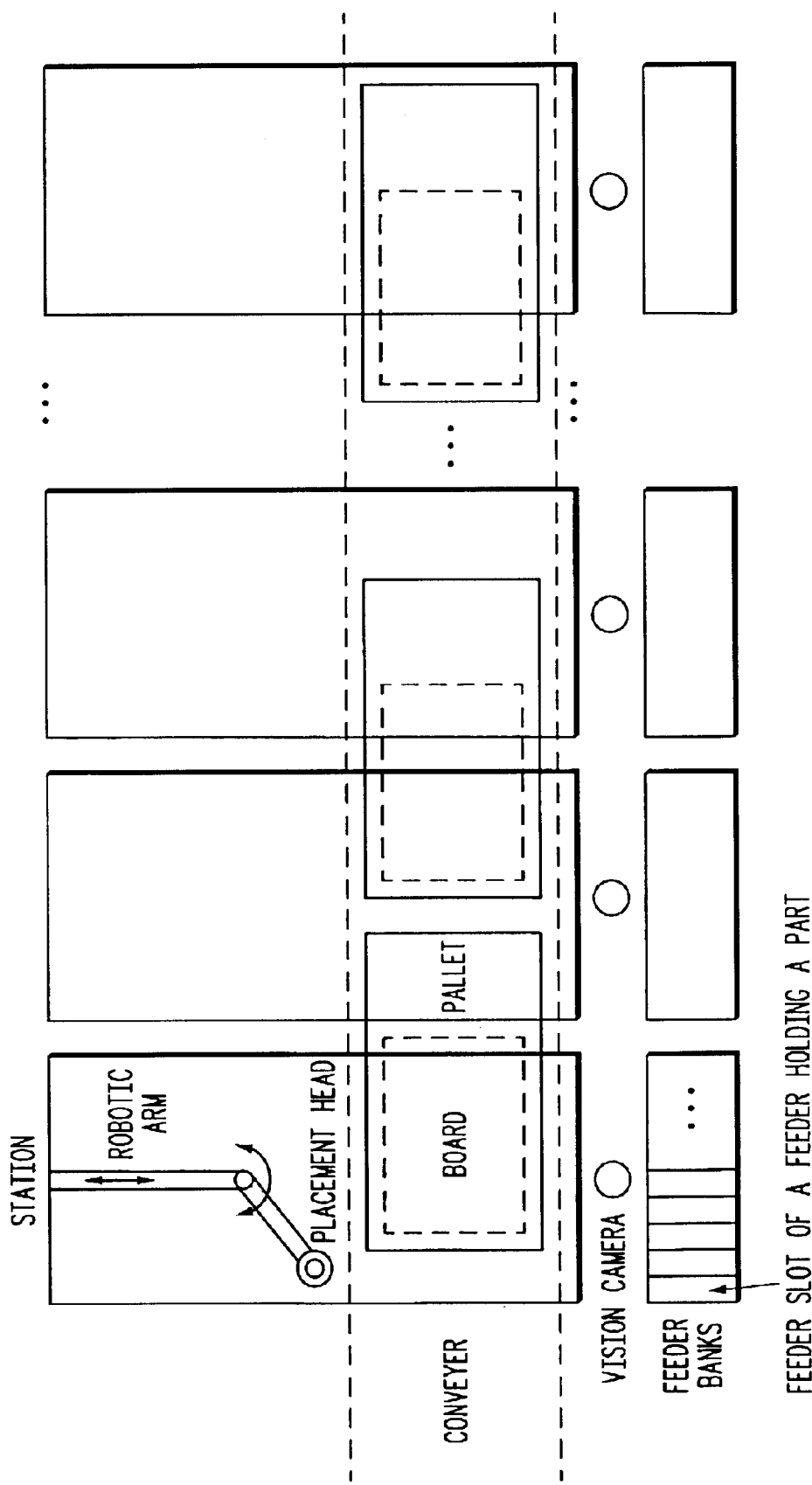
Figure 5:
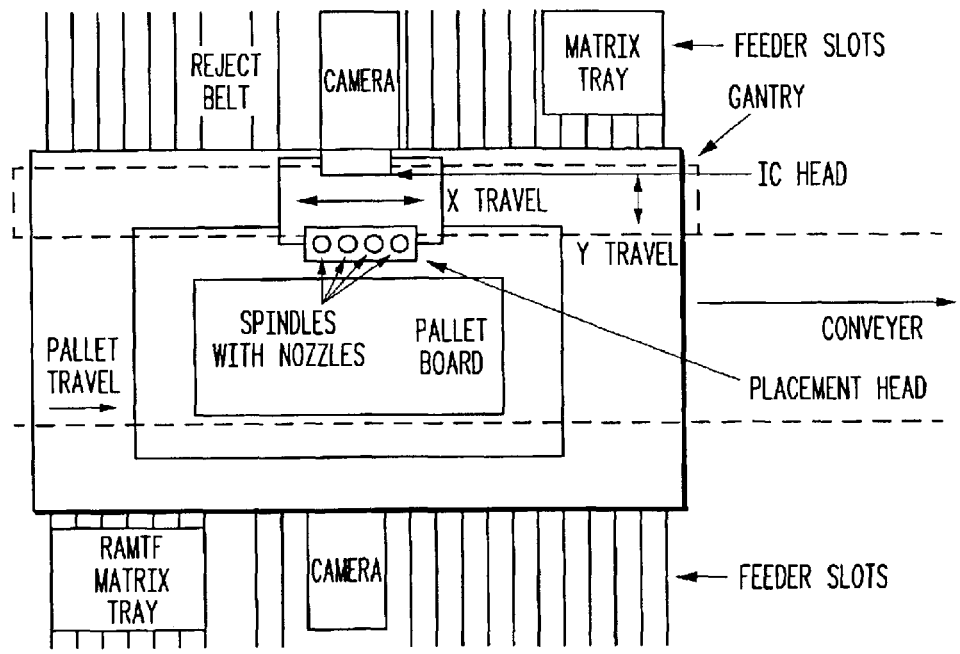
Figure 6:
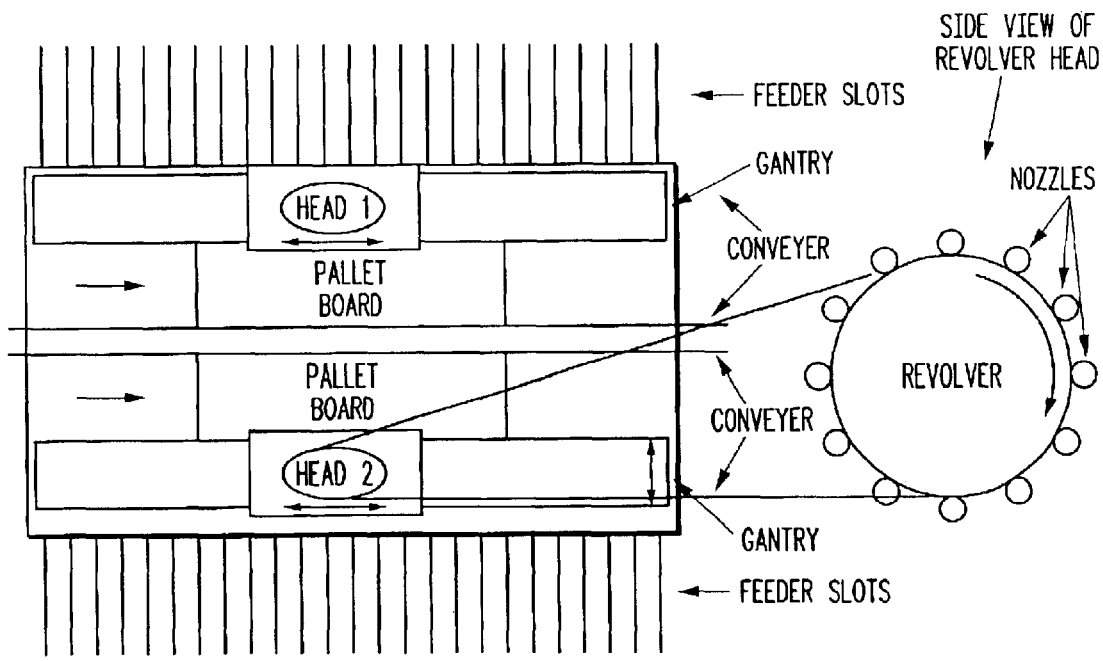

Referring now to the drawings, several figures of machines and feeders as might be used in a factory line are illustrated in FIGS. 1–6. These figures illustrate exemplary manufacturing environments and considerations, such as the high-speed handling and assembly of products having small components, large and/or odd-shaped components, and a multi-station manufacturing line environment. FIG. 1 illustrates a moveable-feeder turret-based machine in which parts or components carried in feeder slots on a feeder carrier are delivered by nozzle clusters of a turret to a board of the product being assembled. FIG. 2 illustrates an example of a typical high-speed assembly machine suitable for handling small parts. Parts in feeder slots of a feeder carriage are deposited into Heads 1, 2, . . . , 12 where they are deposited on a placement table for placement on the board being assembled. FIG. 3 illustrates an assembly machine suitable for placing large and odd-shaped parts. FIG. 4 illustrates a multi-station walking-beam machine suitable for use in a manufacturing line. FIG. 5 illustrates a gantry configuration for placing parts on a board moving through a manufacturing line. FIG. 6 illustrates a dual-gantry, dual-revolver-head machine/station suitable for placing components in a manufacturing line.

Figure 7:
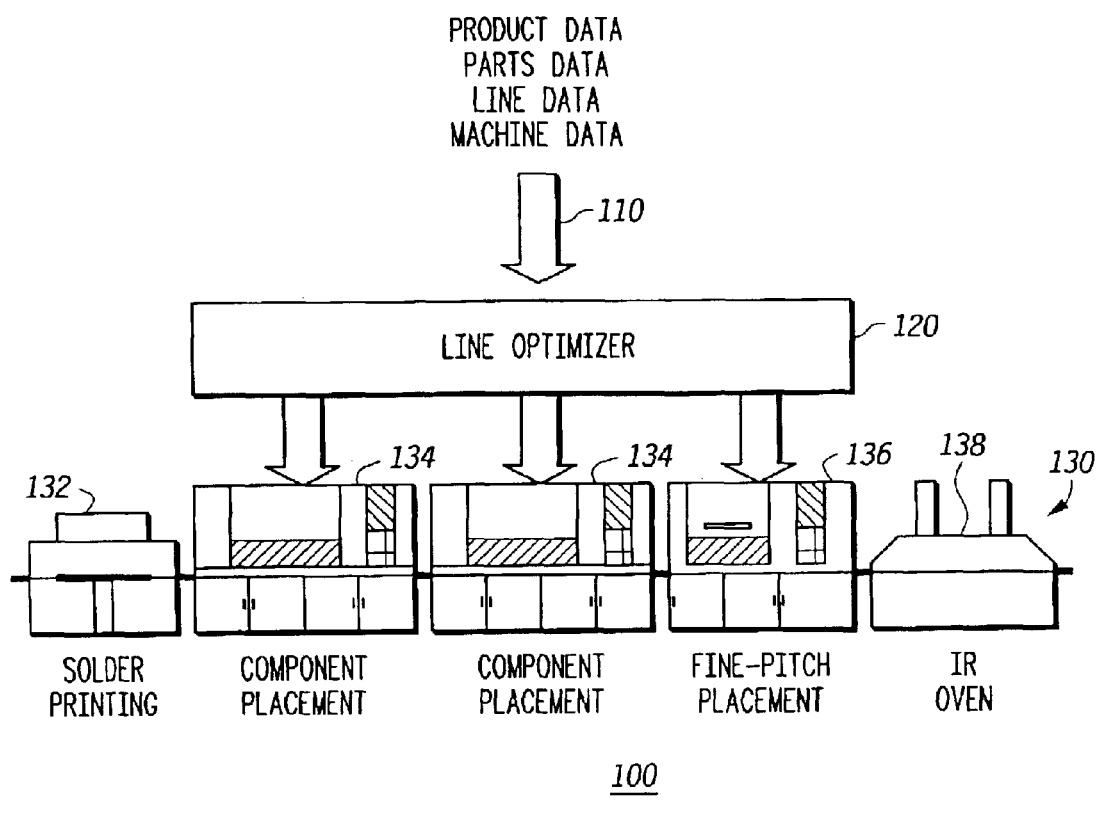
FIG. 7 is a flow chart illustrating a high-level overview of the optimization process in accordance with aspects of the present invention.

Referring now to FIG. 7, a high-level overview 100 of the optimization process in accordance with aspects of the present invention is shown. It can be seen that certain data 110, including product data, parts data, line data, and machine data, are compiled and provided to a line optimizer block 120. Line optimizer block 120 contains a program with an algorithm suitable for formulating and then solving a MILP formulation in order to optimize line balancing and thus minimize throughput of the manufacturing line 130. Factory/manufacturing line 130 may contain many assembly stations and machines in many different configurations as indicated in FIGS. 1–6, and thus the simplified configuration of line 130 is by way of example and not limitation. In this particular illustration, line 130 has a solder printing station 132, followed by two component placement machines 134, referred to as chipshooters since they often place integrated circuits (ICs), a fine-pitch placement station 136 for high-precision components, and finally an infra-red (IR) oven in which the assembled part is cured. It is important to note that, as shown in FIG. 7, the line optimization approach of the present invention does not require the use of so-called machine optimizers following the line-optimizer block 120. This is a significant advance over the prior art, in which machine optimizers, such as one for each machine on the line, would be used as a necessary, additional optimization step following line optimization. The selective definition and manipulation of optimization variables inside the MILP used by line optimizer 120 obviates the need for this additional step.

The input data 110 presented to line optimizer 120 includes product data, parts data, line data and machine data. Product data may include computer-aided-design (CAD) and BOM files of the products and their formats, build quantities, board and panel rail widths, the number of panels and lots to be built. Parts data may include a parts library for part numbers and shape/package types of components, supply/reel information, a shape library for part shape placement parameters on machine models, reel types, available quantities, placement times, feeder sizes, nozzle types, and placement parameters for each machine. Line data may include the number of machines on the line, the types of machines, and the configuration of machines on the line. Machine data may include the number of feeders and other feeder data, part placement times, machine models used in the line and in the factory, setup and load/unload times.

Referring now to FIG. 8, an overview of the throughput optimization of a manufacturing line using MILP formulation, enhancement, solution, and application techniques, in accordance with certain embodiments of the present invention is illustrated. First, at Block 210, data necessary for line optimization is compiled. As discussed above, this data includes various types of component, line, product and machine information. An optional next step, illustrated at Blocks 220 and 230, is to determine whether there are any initial conditions for any machines to be taken into consideration. If so, then an initial condition, such as a fixed (unchangeable) or existing (changeable) initial feeder assignment are specified at Block 230. Next, at Block 240, a balancing strategy is formulated, as reflected in the parameters/variables of the MILP formulation, for achieving line balance between non-bottleneck machines of the line at Block 240. The balancing strategy recommendation may be based upon analysis of the feeder ratio, the total number of required feeders needed for a particular build on the line for a given "run" divided by the number of feeders available on the line for the build. Roughly speaking, if the number of total required feeders exceeds the total available feeders of the line for a proposed build or run, then the flex set-up may be used. If the feeder ratio is less than or equal to a first predetermined value, such as 0.45, indicative of there being adequate feeders for the desired build, then the balancing strategy may be to balance non-bottleneck machines in the line and balance feeder utilization, without utilizing the flex set-up. If the feeder ratio is greater than the first predetermined value and less than or equal to a second predetermined value, such as 0.95, then the recommendation for the balancing strategy may be to simply balance non-bottleneck machines; feeder utilization balancing and flex set-up would not be recommended. If the feeder ratio is greater than the second predetermined value, the recommendation might be to use the flex set-up. This recommendation would be appropriate, for example, in a production run in which feeder requirements are greater than available feeders on a given line. The build could be run on multiple lines or run on one line using the flex set-up. It is noted, that the predetermined values of the feeder ratio, discussed herein, are exemplary and are provided by way of example, not limitation. One skilled in the art will recognize that the particular ranges of the feeder ratio may be changed without departing from the spirit and scope of the invention.

At Decision Block 250, the consideration is whether the strategy embodied in the MILP formulation is acceptable or if it will need to be modified. For instance, if the feeder ratio, discussed above, changes, a previously formulated balancing recommendation may need to be modified to achieve optimal line balancing. If the MILP problem formulation is to be modified, then one or more optimization variables of the MILP formulation are accordingly modified. Once the desired line balancing strategy is obtained, then the MILP is formulated and solved at Block 270. The formulation of the MILP algorithm referenced in Blocks 220–270 is discussed in more detail in the MILP Formulation section.

Solving the MILP will generate a number of output reports and metrics at Block 280 that are used to assess the success of the particular MILP formulation. Types of reports include by way of example, and not limitation, the following: a general analysis report, a part on board array report, a part usage summary, a reel replenishment report, a custom part usage report, a standard part change report, a part list with metrics, and a standard part usage report. The general analysis report may be a primary report file containing statistics such as board processing time at each machine in the line, bottleneck machines for each line, part placement time per board, feeder usage statistics, cycle time statistics, etc. The part on board array report may describe which parts are used on which boards and in what quantities. The part usage summary is a report that describes the number of reels of each part that will be required to satisfy the build plan. The reel replenishment report contains information similar to the part usage summary. The custom part usage report describes any custom parts or "flex setup" parts, parts that are assigned to a machine for which no feeders are available, for each machine of the line. The flex setup option is discussed further in the MILP Formulation section below. The standard part change report describes changes to the machines' setups, if any are required. The part list with metrics is a report generated for each machine that lists the parts assigned to the machine and their required quantities. The standard part usage report is similar but includes part list metrics for all the machines of the line.

From the reports and metrics generated at Block 280, a determination can be made at Decision Block 300 of whether to assign components to feeders. If no, the MILP process ends and machine-level optimization may be performed determine final feeder assignments. If yes, then in Decision Block 305 it needs to be determined if any initial setup was specified. If no, then feeder locations can be assigned according to component priorities in Block 315. High priority components can be placed at either end of the feeder bank in a linearly increasing or decreasing arrangement, or in the middle, forming a triangular distribution. If there was an initial setup specified, the question addressed at Decision Block 310 is whether the part assignments need to be appended or changed. If the component assignments need to be appended, this indicates there are remaining parts that need to be assigned and that the part assignments specified in the fixed feeder setup file are maintained and the remaining parts are appended to available locations at Block 320. If the part assignments need to be changed, then the part assignments specified in the existing feeder setup file are changed and any remaining parts are appended to available locations at Block 330.

MILP Formulation
Best Production Time Formulation

Line balancing in accordance with the present invention uses a MILP programming method to minimize total production time, i.e., Minimize production_time    Equation 1 where $$\text{production\_time} = \sum_i \text{production\_time}_i \quad \text{Equation 2}$$

in which, production_time$_i$ is the production time of product i. The production time of product i can be defined as the peak assembly time of the line, i.e., for all station j in the line production_time$_i \geq$ panel_quantity$_i \cdot$ assemble_time$_{ij}$    Equation 3 where panel_quantity$_i$ is the total number of panels of product i; assemble_time$_{ij}$ is the assembly time of one panel of product i on station j, which can be defined as $$\text{assemble\_time}_{ij} = \sum_k \text{placement\_time}_{jk} Y_{ijk} + \text{load\_time}_j \quad \text{Equation 4}$$

in which, placement_time$_{jk}$ is the placement time for part k on station j. $Y_{ijk}$ is the quantity of part k that is assigned to station j for the product i. load_time$_j$ is the load and unload operation time for each panel at the station j.

Let part_quantity$_{ik}$ be the total quantify of part k on one panel of product i. $X_{jk} \in \{0,1\}$ is the assignment flag for part k on station j. Then, the amount of the part k on station j for the product i should not exceed the total quantity of the part used, $$Y_{ijk} \leq \text{part\_quantity}_{ik} X_{jk} \quad \text{Equation 5}$$

In addition, all the parts k for the product i should be placed:

$$\sum_j Y_{ijk} = \text{part\_quantity}_{ik} \quad \text{Equation 6}$$

If a part k can be assigned to more than one station but should not be assigned to more than m stations, the part-on-station flag $X_{jk}$ should be constrained as $$\sum_j X_{jk} \leq m \quad \text{Equation 7}$$

In the case where an existing or fixed setup is used, i.e. for a part k that must be placed on a given station j, the constraint can be expressed as, $$X_{jk} = 1 \quad \text{Equation 8}$$

The constraint for a part k that can not be placed on a given station j can be expressed as, $$X_{jk} = 0 \quad \text{Equation 9}$$

Let total_feeder$_j$ be the total number of available feeders of station j. feeder_slot$_{jk}$ is the required number of feeders for part k on station j. The available feeders on station j should not be less than the feeders that are needed to assemble product i, i.e., $$\text{total\_feeder}_j \geq \sum_k \text{feeder\_slot}_{jk} X_{jk} \quad \text{Equation 10}$$

Limit Changes to Existing Setup

An optional modification that may be made to the MILP representation concerns making changes to an existing feeder setup. If an existing feeder setup is not optimized or if a full optimization, which would potentially rearrange the part distribution as well as the feeder setup, is also not desired, then an optimization that employs limited part changes from the existing setup would be useful.

Let on_station$_{jk} \in \{0,1\}$ be the assignment flag of part k on station j in an existing setup. delta_plus$_{jk} \in \{0,1\}$ is the flag of part k in the existing feeder setup on station j but not in the new feeder setup, as given in $X_{jk}$. delta_minus$_{jk} \in \{0,1\}$ is the flag of part k not in the existing feeder setup on station j but in the new feeder setup, as given in $X_{jk}$. n is the number of allowed part changes from the existing feeder setup to the new feeder setup. Then, the additional constraints for limiting changes to the existing setup are:

$$delta\_plus_{jk} - delta\_minus_{jk} = on\_station_{jk} - X_{jk} \quad \text{Equation 11}$$

$$\sum_{j,k}(delta\_plus_{jk} + delta\_minus_{jk}) \leq n \quad \text{Equation 12}$$

Optimize Part Reel Replenishments Times

Reel replenishment time can cause a significant impact on the overall production time, especially for high-mix assembly operations. Reel replenishment refers to the estimated time to replace a reel of parts or components on a machine and affects the cycle time and load balancing calculations. Reel replenishment is thus an optimizable variable that can be minimized and thus significantly contribute to overall throughput optimization.

Let $reel\_size_k$ be the reel size of part k. $replen\_time_j$ is the reel replenishment time of station j. Then, the reel replenishment impact on the placement time per part can be expressed as $$reel\_time_{jk} = \frac{replen\_time_j}{reel\_size_k} \quad \text{Equation 13}$$

Equation 4 for the assembly time of one panel of product i on station j should be modified to be $$assemble\_time_j =$$
$$\sum_k (placement\_time_{jk} + reel\_time_{jk}) Y_{ijk} + load\_time_j \quad \text{Equation 14}$$

Use Flex Setup

In a multi-product scenario, total feeder requirements for all the products might exceed the available feeders. An optional modification to the MILP formulation involves tweaking and appending part assignments. High-run parts may be set as fixed, and a portion of feeders may be reserved on each station for each product as flex or custom setup so there will be enough feeders for each product while still maintaining relatively good production and feeder setup time.

Let $Z_{ijk} \epsilon \{0,1\}$ be the flag for the flex part k on station j for product i. $setup\_time_j$ is the feeder setup time of station j. Equation 3 for the production time of any product i should be modified to be $$production\_time_i \geq$$
$$panel\_quantity_i \cdot assemble\_time_j + setup\_time_j \sum_{j,k} Z_{ijk} \quad \text{Equation 15}$$

For a part k in the fixed setup on station j that should not be in the flex setup for any product i, the constraint is $$X_{jk} + Z_{ijk} \geq 1 \quad \text{Equation 16}$$

For a part k that can not be on a given station j for any product i, the constraint is $$Z_{ijk} = 0 \quad \text{Equation 17}$$

Equation 5 for the amount of part k on station j for product i should be modified to be $$Y_{ijk} \geq part\_quantity_{ik}(X_{jk} + Z_{ijk}) \quad \text{Equation 18}$$

Equation 7 for any part k that can be placed on more than one station but less than m stations for all products should be modified to be $$\sum_j (X_{jk} + Z_{ijk}) \leq m \quad \text{Equation 19}$$

Equation 10 for the total feeder slot requirement of each product i should also be modified to be $$total\_feeder_j \geq \sum_k feeder\_slot_{jk}(X_{jk} + Z_{ijk}) \quad \text{Equation 20}$$

Balance Feeder Carriage Utilization

It is generally desired that the feeder usage over different stations be balanced so that no stations are overloaded beyond their feeder capacity. This can be achieved by adding a weight function for feeder usage into the production time objective function (Equation 1) as follows $$\text{Minimize production\_time} + FD \quad \text{Equation 21}$$

where $$FD = FD\_weight \sum_{r,s} FD\_diff_{rs} \quad \text{Equation 22}$$

in which, FD_weight is the weight for feeder difference. FD_diffr$_{rs}$ is the feeder usage ratio difference between station r and s, which is defined as $$FD\_diff_{rs} \geq feeder\_usage_r - feeder\_usage_s \quad \text{Equation 23}$$

$$FD\_diff_{rs} \geq feeder\_usage_s - feeder\_usage_r \quad \text{Equation 24}$$

and $$feeder\_usage_j = \frac{used\_feeder_j}{total\_feeder_j} \quad \text{Equation 25}$$

$$used\_feeder_j \geq \sum_k feeder\_slot_{jk}(X_{jk} + Z_{ijk}) \quad \text{Equation 26}$$

Balance Non-Bottleneck Stations

It is also generally desired that the non-bottleneck stations be balanced to prevent another station from becoming a bottleneck in case of assembly sequence problems, such as miss-picks or other errors. This can be achieved by adding a weight function for assembly time differences into the production time objective function (Equation 21) as follows $$\text{Minimize production\_time} + FD + BT \quad \text{Equation 27}$$

where $$BT = BT\_weight \sum_{i,r,s} BT\_diff_{irs} \quad \text{Equation 28}$$

in which, BT_weight is the weight for the assembly time difference. BT_diff$_{irs}$ is the assembly time difference between station r and s for product i, which is defined as $$BT\_diff_{irs} \geq assemble\_time_{ir} - assemble\_time_{is} \quad \text{Equation 29}$$

$$BT\_diff_{irs} \geq assemble\_time_{is} - assemble\_time_{ir} \quad \text{Equation 30}$$

Constrained Assembly Procedure: Large Part/Shield Constraints

Assembly procedures may be subjected to part size and shape constraints, such as heavy and large parts that need to be placed as late as possible, and parts that must be placed before a shield can be placed over them. Some large components, for example, may take up two to three feeder slots instead of one slot. The algorithm representation of the MILP formulation can handle components of different sizes. Affects upon part assignments are taken into consideration.

Part A Placed at or before Station N

Let Part be the part list. $k_a$ is the index of the part A in the Part list. Station is the station list, and $S_n$ is the index of the station N in the Station list. The constraint that part A be placed at or before station N can expressed as $$X_{jk_a}=0 \text{ for all } j>S_n \qquad \text{Equation 31}$$

If part A should be placed at or after the station N, the constraint is $$X_{jk_a}=0 \text{ for all } j<S_n \qquad \text{Equation 32}$$

If a flex setup method is used, then Equations 31 and 32 should be modified to include the flex parts, $Z_{ijk}$ $$X_{jk_a}+Z_{ijk_a}=0 \text{ for all } j>S_n \qquad \text{Equation 33}$$

$$X_{jk_a}+Z_{ijk_a}=0 \text{ for all } j<S_n \qquad \text{Equation 34}$$

Part A Placed at a Station before Part B

Let $k_a$ be the index of part A in the Part list, and $k_b$ be the index of part B in the Part list. MaxStation is the total number of stations in the line. The constraint that part A should be placed at a station before part B is placed can be expressed as:

$$MaxStation \cdot X_{jk_b} + \sum_{r \geq j} X_{rk_a} \leq MaxStation \qquad \text{Equation 35}$$

$$\text{for } j = 1, \ldots, MaxStation$$

The above equation ensures that if part B is placed at station j, i.e., $X_{jk_{b-1}}$ and $MaxStation \cdot X_{jk_b}=MaxStation$, then the placement flag $X_{rk_a}=0$ for every station $r \geq j$ for part A. So part A cannot be placed at or after the station that part B is placed.

If the part A should be placed at the same station as or before part B, then Equation 35 can be modified to be $$MaxStation \cdot X_{jk_b} + \sum_{r>j} X_{rk_a} \leq MaxStation \qquad \text{Equation 36}$$

$$\text{for } j = 1, \ldots, MaxStation$$

If a flex setup method is used, then Equations 35 and 36 should be modified to include the flex parts, $Z_{ijk}$, $$MaxStation(X_{jk_b} + Z_{ijk_b}) + \sum_{r \geq j}(X_{rk_a} + Z_{irk_a}) \leq MaxStation \text{ for } j = 1, \ldots, MaxStation \qquad \text{Equation 37}$$

$$MaxStation(X_{jk_b} + Z_{ijk_b}) + \sum_{r>j}(X_{rk_a} + Z_{irk_a}) \leq MaxStation \text{ for } j = 1, \ldots, MaxStation \qquad \text{Equation 38}$$

Part A Placed as Late as Possible

Let $k_a$ be the index of part A in the Part list. PT_weight is the time penalty weight for placing a part one station earlier than desired. MaxStation is the total number of stations in the line. The time penalty for placing part A too early can be expressed as $$PT_a = PT\_weight \sum_j (MaxStation - j)X_{jk_a} \qquad \text{Equation 39}$$

Thus, the time penalty for all the parts that were not placed as late as possible is $$PT = \sum_a PT_a \qquad \text{Equation 40}$$

The objective function (Equation 27) can be modified by Equation 40 to reflect the requirement of placing given parts as late as possible:

$$\text{Minimize production\_time}+FD+BT+PT \qquad \text{Equation 41}$$

If a flex setup method is used, then Equation 40 should be modified to include the flex parts, $Z_{ijk}$ $$PT_a = PT\_weight \sum_j (MaxStation - j)(X_{jk_a} + Z_{ijk_a}) \qquad \text{Equation 42}$$

From the foregoing description, it can be seen that the line-balancing approach of the present invention, in which optimization variables of a MILP representation may be selectively changed and optimized, provides an advantageous and novel approach. Multi-product optimization and flexibility with regard to strategy is provided. Fixed feeder setups may be appended and existing feeder setups may be selectively tweaked and modified as needed to optimize feeder utilization and assignment. Placement across non-bottleneck machines may be balanced, and reel replenishment times are optimizable. Additional constraints resulting from non-uniform or conforming components, such as large parts and shielding components, may be included in the optimization approach.

Although the present invention has been described at times in terms of a SMT line technology, those skilled in the art will appreciate that the techniques described herein are equally applicable to any factory line or machine in which throughput optimization through the selective balancing techniques in accordance with the present invention may be utilized. Thus, any such system is intended to fall within the scope of the present invention.

Those skilled in the art will recognize that the process of the present invention can be implemented with the use of a programmed computer, programmed digital signal processor (DSP) carrying out the operations defined by the MILP. However, the invention should not be so limited, since the present invention could be implemented using hardware component equivalents such as special purpose hardware and/or dedicated or general-purpose processors that are equivalents to the invention as described and claimed. Similarly, general purpose computers, microprocessor based computers, micro-controllers, optical computers, analog computers, digital signal processors, dedicated processors and/or dedicated hard wired logic may be used to construct alternative equivalent embodiments of the present invention.

Those skilled in the art will appreciate that the program steps and associated data used to implement the embodiments described above can be implemented using any suitable electronic storage medium such as for example disc storage, Read Only Memory (ROM) devices, Random Access Memory (RAM) devices; optical storage elements, magnetic storage elements, magneto-optical storage elements, flash memory, core memory and/or other equivalent storage technologies without departing from the present invention. Such alternative storage devices should be considered equivalents.

The present invention, as described in embodiments herein, is implemented using a programmed processor executing programming instructions that are broadly described above in flow chart form that can be stored on any suitable electronic storage medium (e.g., disc storage, optical storage, semiconductor storage, etc.) or transmitted over any suitable electronic communication medium. However, those skilled in the art will appreciate that the processes described above can be implemented in any number of variations and in many suitable programming languages without departing from the present invention. For example, the order of certain operations carried out can often be varied, additional operations can be added or operations can be deleted without departing from the invention. Error trapping can be added and/or enhanced and variations can be made in user interface and information presentation without departing from the present invention. Such variations are contemplated and considered equivalent.

While the invention has been described in conjunction with specific embodiments, it is evident that many alternatives, modifications, permutations and variations will become apparent to those of ordinary skill in the art in light of the foregoing description. Accordingly, it is intended that the present invention embrace all such alternatives, modifications and variations as fall within the scope of the appended claims.

What is claimed is:

1. A method of optimization of a product assembly line having a plurality of machines, comprising:
    compiling a plurality of line information, comprising a plurality of product data of one or more products to be assembled by the product assembly line, a plurality of parts data of a plurality of parts to assemble the one or more products, a plurality of line data of the product assembly line, and a plurality of machine data of the plurality of machines of the product assembly line;
    formulating a balancing strategy for the product assembly line by the selective manipulation of a plurality of optimization variables in a mixed-integer linear program (MILP), said selective manipulation adding or removing optimization variables in the MILP;
    solving the MILP to generate MILP output information; and
    generating one or more reports and metrics from the MILP output information.

2. The method of claim 1, wherein formulating the balancing strategy comprises:
    determining a total feeder requirement to build the one or more products from the plurality of line information; and
    if the total feeder requirement exceeds a plurality of available feeders of the product assembly line, formulating the balancing strategy with a flex setup.

3. The method of claim 2, further comprising:
    if the total feeder requirement does not exceed the plurality of available feeders of the product assembly line, designating one or more parts of the plurality of parts to run on one or more of the plurality of machines.

4. The method of claim 1, wherein prior to solving the MILP, further comprising:
    determining whether to accept the balancing strategy; and
    if the balancing strategy is not accepted, modifying one or more of the plurality of optimization variables.

5. The method of claim 1, wherein prior to solving the MILP, specifying a plurality of initial feeder assignments of one or more of the plurality of machines.

6. The method of claim 5, wherein specifying the plurality of initial feeder assignments comprises specifying one or more of a fixed initial feeder assignment and an existing initial feeder assignment.

7. The method of claim 1, wherein the plurality of optimization variables comprises one or more of part-to-station assignments, estimated workloads, changing existing setup, parts reel replenishment optimization, flexible/custom setup, feeder utilization optimization, non-bottleneck stations balancing, multi-product optimization and component constraints.

8. The method of claim 1, wherein the plurality of optimization variables comprise a total production time variable and further comprising formulating the balancing strategy for the product assembly line by the selective manipulation of the total production time variable in the MILP.

9. The method of claim 8, wherein the plurality of optimization variables further comprise a reel replenishment optimization variable and further comprising formulating the balancing strategy for the product assembly line by the selective manipulation of the total production time variable and the reel replenishment optimization variable in the MILP.

10. The method of claim 8, wherein the plurality of optimization variables further comprise a balance feeder weighting function variable added to the total production time variable and further comprising formulating the balancing strategy for the product assembly line by the selective manipulation of the total production time variable and the balance feeder weighting function variable in the MILP.

11. The method of claim 8, wherein the plurality of optimization variables further comprise a balance feeder weighting function variable and an assembling time difference weighting function variable added to the total production time variable and further comprising formulating the balancing strategy for the product assembly line by the selective manipulation of the total production time variable, the balance feeder utilization variable and the assembling time difference weighting function variable in the MILP.

12. The method of claim 8, wherein the plurality of optimization variables further comprise an assembling process constraint variable and further comprising formulating the balancing strategy for the product assembly line by the selective manipulation of the total production time variable and the assembling process constraint variable in the MILP.

13. The method of claim 1, further comprising:
    assigning the plurality of parts to a plurality of feeders of the plurality of machines in accordance with the metric information generated by solving the MILP.

14. The method of claim 13, wherein assigning the plurality of parts further comprises:
    maintaining a part assignment of the plurality of parts specified in a fixed feeder setup file of the plurality of machine data and appending a plurality of remaining parts to a plurality of available locations of the plurality of feeders.

15. The method of claim 13, wherein assigning the plurality of parts further comprises:
    changing a part assignment of the plurality of parts specified in an existing feeder setup file of the plurality of machine data and appending a plurality of remaining parts to a plurality of available locations of the plurality of feeders.

16. The method of claim 1, wherein formulating the balancing strategy comprises:

determining a feeder ratio of a total feeder requirement for a build on the product assembly line to a total number of available feeders on the product assembly line;

if the feeder ratio is less than or equal to a first predetermined value, formulating the balancing strategy to recommend balancing one or more non-bottleneck machines of the plurality of machines and balancing a feeder utilization of the plurality of machines of the product assembly line;

if the feeder ratio is greater than the first predetermined value and less than or equal to a second predetermined value, formulating the balancing strategy to recommend balancing the one or more non-bottleneck machines;

if the feeder ratio is greater than the second predetermined value, formulating the balancing strategy with a flex set-up.

17. A method for generating a balancing strategy of a product assembly line having a plurality of machines, comprising:

compiling a plurality of line information, comprising a plurality of product data of one or more products to be assembled by the product assembly line, a plurality of parts data of a plurality of parts to assemble the one or more products, a plurality of line data of the product assembly line, and a plurality of machine data of the plurality of machines of the product assembly line; and formulating the balancing strategy for the product assembly line by the selective manipulation of a plurality of optimization variables in a mixed-integer linear program (MILP)), said selective manipulation adding or removing optimization variables in the MILP;

wherein the plurality of optimization variables in the MILP comprise a total production time variable and formulating the balancing strategy for the product assembly line comprises selectively manipulating the total production time variable in the MILP.

18. The method of claim 17, wherein formulating the balancing strategy further comprises:

determining a total feeder requirement to build the one or more products from the plurality of line information; and if the total feeder requirement exceeds a plurality of available feeders of the product assembly line, formulating the balancing strategy with a flex setup.

19. The method of claim 18, further comprising:

if the total feeder requirement does not exceed the plurality of available feeders of the product assembly line, designating one or more parts of the plurality of parts to run on one or more of the plurality of machines.

20. The method of claim 17, wherein the plurality of optimization variables further comprise a reel replenishment optimization variable and formulating the balancing strategy further comprises selectively manipulating the total production time variable and the reel replenishment optimization variable in the MILP.

21. The method of claim 17, wherein the plurality of optimization variables further comprise a balance feeder weighting function variable added to the total production time variable and formulating the balancing strategy further comprises selectively manipulating the total production time variable and the balance feeder weighting function variable in the MILP.

22. The method of claim 17, wherein the plurality of optimization variables further comprise a balance feeder weighting function variable and an assembling time difference weighting function variable added to the total production time variable and formulating the balancing strategy further comprises selectively manipulating the total production time variable, the balance feeder utilization variable and the assembling time difference weighting function variable in the MILP.

23. The method of claim 17, wherein the plurality of optimization variables further comprise an assembling process constraint variable and formulating the balancing strategy further comprises selectively the total production time variable and the assembling process constraint variable in the MILP.

24. The method of claim 17, further comprising:

solving the MILP to generate MILP output information; and generating one or more reports and metrics from the MILP output information.

25. The method of claim 24, wherein prior to solving the MILP further comprising:

determining whether to accept the balancing strategy; and if the balancing strategy is not accepted, modifying one or more of the plurality of optimization variables.

26. The method of claim 24, wherein prior to solving the MILP, specifying a plurality of initial feeder assignments of one or more of the plurality of machines.

27. The method of claim 17, wherein formulating the balancing strategy further comprises:

determining a feeder ratio of a total feeder requirement for a build on the product assembly line to a total number of available feeders on the product assembly line;

if the feeder ratio is less than or equal to a first predetermined value, formulating the balancing strategy to recommend balancing one or more non-bottleneck machines of the plurality of machines and balancing a feeder utilization of the plurality of machines of the product assembly line;

if the feeder ratio is greater than the first predetermined value and less than or equal to a second predetermined value, formulating the balancing strategy to recommend balancing the one or more non-bottleneck machines;

if the feeder ratio is greater than the second predetermined value, formulating the balancing strategy with a flex set-up.

* * * * *